(12) United States Patent  
Salonen et al.

(10) Patent No.: US 7,321,267 B2  
(45) Date of Patent: Jan. 22, 2008

(54) COMPENSATING CAPACITIVE DIELECTRIC ABSORPTION INDUCED FREQUENCY ERROR IN A PHASE LOCKED LOOP

(75) Inventors: Vesa Salonen, Littoinen (FI); Sami Vilhonen, Littoinen (FI)

(73) Assignee: Nokia Corporation, Espoo (FI)

( * ) Notice: Subject to any disclaimer, the term of this patent is extended or adjusted under 35 U.S.C. 154(b) by 96 days.

(21) Appl. No.: 11/102,936

(22) Filed: Mar. 23, 2005

(65) Prior Publication Data

US 2006/0214736 A1 Sep. 28, 2006

(51) Int. Cl.  
*H03L 7/087* (2006.01)

(52) U.S. Cl. .......................... 331/11; 327/157; 375/376

(58) Field of Classification Search .................. 331/11; 327/157; 375/376  
See application file for complete search history.

(56) References Cited

U.S. PATENT DOCUMENTS

| | | | |
|---|---|---|---|
| 4,097,812 A | 6/1978 | Rzeszewski | |
| 4,280,104 A | 7/1981 | Rzeszewski | |
| 5,754,607 A | 5/1998 | Powell et al. | 375/373 |
| 6,803,827 B1 * | 10/2004 | Kenney et al. | 331/16 |
| 7,049,866 B2 * | 5/2006 | Wilson | 327/157 |
| 2004/0100311 A1 | 5/2004 | Balm et al. | |
| 2005/0095992 A1 * | 5/2005 | Thompson | 455/76 |

FOREIGN PATENT DOCUMENTS

| WO | 00/14882 A | 3/2000 |
|---|---|---|
| WO | 03/67762 A | 8/2003 |

* cited by examiner

*Primary Examiner*—Robert Pascal  
*Assistant Examiner*—James Goodley

(57) ABSTRACT

A PLL comprises a VCO and a loop filter, wherein the VCO generates an AC output signal having a frequency which depends on an applied control voltage, and wherein the loop filter provides a control voltage to the VCO. The control voltage reflects determined phase differences between a potentially frequency divided output signal of the VCO and a reference signal. When operating the PLL, frequency deviations between a potentially frequency divided output signal of the VCO and a reference signal are detected and in addition, a resolution employed for detecting the frequency deviations is lower than a resolution employed for determining the phase differences. In case a frequency deviation is detected, a direct-current voltage shift is added to the control voltage provided by the loop filter.

19 Claims, 4 Drawing Sheets

COMPENSATING CAPACITIVE DIELECTRIC ABSORPTION INDUCED FREQUENCY ERROR IN A PHASE LOCKED LOOP

FIELD OF THE INVENTION

The invention relates to a method for operating a phase locked loop (PLL). The invention relates equally to a PLL and to components, devices and systems comprising a PLL.

BACKGROUND OF THE INVENTION

PLLs can be used, for example, for realizing frequency synthesizers of cellular phones. In a cellular phone, a frequency synthesizer is an essential part of a radio receiver integrated circuit (IC) and of a radio transmitter IC.

A typical PLL comprises, connected to each other in a loop in this order, a voltage controlled oscillator (VCO), a programmable frequency divider, a phase detector, a charge pump and a loop filter.

The VCO transforms a low frequency control voltage, in particular a direct-current (DC) control voltage, into a radio frequency (RF) signal. A change of the control voltage is reflected in a change of frequency of the generated RF signal in accordance with the gain of the VCO. The frequency of the signal output by the VCO is divided by a factor currently set in the programmable frequency divider. The phase comparator then compares the phase of the resulting frequency divided signal with the phase of a reference signal, and outputs a signal representing the detected phase difference. The charge pump generates current impulses, the length of which are controlled by the output signal of the phase detector. The generated current pulses are filtered by the loop filter, which provides a corresponding DC control voltage to the VCO and thus takes care that the VCO generates a signal which is locked to a desired frequency.

The frequency of the RF signals output by the VCO can be changed by changing the division ratio applied by the programmable divider.

The loop filter of the PLL may be active or passive and is typically some kind of an RC-filter. It includes at least one capacitor storing the driving DC control voltage for the VCO in order to ensure a stable supply of the DC control voltage to the VCO.

When the division ratio applied by the frequency divider is changed in order to change the frequency of the VCO output signal, the phase detector detects suddenly a large phase difference between the frequency divided VCO output signal and the reference signal. As a result, the voltage over the capacitor of the loop filter changes rapidly. In the dielectric insulator layer of a capacitor, there exists a physical phenomenon called dielectric absorption. The dielectric absorption is a consequence of a slowness of molecule dipoles in a dielectric material. After a rapid voltage change, the phenomenon tends to partly move the voltage across the capacitor back to the original value.

FIG. 1 presents a model of the dielectric absorption of a capacitor $C_{11}$. The model includes a resistor-capacitor (RC) circuit, comprising a series connection of a resistor $R_{11}$ and of a capacitor $C_{12}$, which is arranged in parallel with the actual capacitor $C_{11}$. The RC circuit causes the parasitic side effect.

For external, non-integrated loop filters, solid capacitors of the np0 type are available, for which the dielectric absorption is at a level that PLL settling time specifications can be met. This kind of capacitor cannot be integrated, however, so this solution is expensive.

In highly dielectric capacitors, in contrast, which are used in modern integrated circuits, the effect of the dielectric absorption is significant. In the case of integrated capacitors, the time constant of the parasitic RC circuit depicted in FIG. 1 can be some milliseconds or even more. This makes a PLL equipped with such a capacitor too slow for some applications, for instance for a usage in a cellular phone.

In U.S. patent application 2004/0100311 A1, the problem of the dielectric absorption of PLL loop filter capacitors in conjunction with the change in the tuning voltage of a PLL is addressed as well. In this document, it is proposed to compensate for the memory effect of the loop filter capacitors by means of a resonant frequency pre-selection in the VCO. To this end, the VCO has a frequency-determining capacitance controlled through a second tuning input. It is proposed that this capacitance is controlled by the same frequency word as the frequency divider such that a change in the tuning voltage upon a change in the frequency word is as small as possible.

It is a disadvantage of such an approach that the accuracy may not be satisfactory due to the fact that a PLL includes many variables that cannot be predicted by reading the divider input. This applies in particular to component variations and thermal drifts. The resulting system thus needs a lot of frequency overlapping between each rough step. As a consequence, the design of the most critical components, for example the VCO, becomes very difficult. Further, the window in which the system is able to tune the VCO might be too large to avoid the memory effect.

SUMMARY OF THE INVENTION

It is an object of the invention to provide a different solution for dealing with the dielectric absorption in loop filter capacitors of a PLL. It is an object of the invention to enable the use of integrated loop filters without requiring an adjustment of the resonance frequency of the VCO.

A method for operating a PLL is proposed. The PLL is assumed to comprises a VCO and a loop filter. The VCO generates an alternating-current (AC) output signal having a frequency which depends on an applied control voltage. The loop filter provides a control voltage to the VCO, which reflects determined phase differences between a potentially frequency divided output signal of the VCO and a reference signal. The proposed method comprises detecting frequency deviations between a potentially frequency divided output signal of the VCO and a reference signal, wherein a resolution employed for detecting the frequency deviations is lower than a resolution employed for determining the phase differences. The proposed method further comprises adding a DC voltage shift to the control voltage provided by the loop filter, in case a frequency deviation is detected.

Moreover, a PLL is proposed, which comprises means for generating an alternating-current output signal having a frequency which depends on an applied control voltage. The proposed PLL further comprises means for providing a control voltage to the means for generating an alternating-current output signal, the control voltage reflecting determined phase differences between a potentially frequency divided output signal of the means for generating an alternating-current output signal and a reference signal. The proposed PLL further comprises means for detecting frequency deviations between a potentially frequency divided output signal of the means for generating an alternating-current output signal and a reference signal, wherein a resolution employed for detecting the frequency deviations is lower than a resolution employed for determining the phase differences. The proposed PLL further comprises means for adding a direct-current voltage shift to a control voltage provided by the loop filter, in case a frequency deviation is detected by the means for detecting frequency deviations.

Moreover, a PLL is proposed, which comprises a VCO adapted to generate an AC output signal having a frequency which depends on an applied control voltage. The proposed PLL further comprises a loop filter adapted to provide a control voltage to the VCO. The control voltage reflects determined phase differences between a potentially frequency divided output signal of the VCO and a reference signal. The proposed PLL further comprises a coarse tuning circuit. The coarse tuning circuit is adapted to detect frequency deviations between a potentially frequency divided output signal of the VCO and a reference signal. A resolution employed for detecting the frequency deviations is lower than a resolution employed for determining the phase differences. The coarse tuning circuit is further adapted to add a DC voltage shift to a control voltage provided by the loop filter, in case a frequency deviation is detected.

Moreover, a frequency synthesizer, an IC, a radio receiver, a radio transmitter and an electronic device are proposed, which comprise the proposed PLL.

Moreover, a communication system is proposed, which comprises at least one electronic device including the proposed PLL.

Finally, a software program product is proposed, in which a software code for operating a phase locked loop is stored. The phase locked loop is assumed to comprise a voltage controlled oscillator and a loop filter, wherein the voltage controlled oscillator generates an alternating-current output signal having a frequency which depends on an applied control voltage, and wherein the loop filter provides a control voltage to the voltage controlled oscillator. The control voltage reflects determined phase differences between a potentially frequency divided output signal of the voltage controlled oscillator and a reference signal. When being executed, the software code detects frequency deviations between a potentially frequency divided output signal of the voltage controlled oscillator and a reference signal, wherein a resolution employed for detecting the frequency deviations is lower than a resolution employed for determining the phase differences. The software code further causes an adding of a direct-current voltage shift to the control voltage provided by the loop filter, in case a frequency deviation is detected.

The invention proceeds from the idea that the tuning of a PLL could be split up into two parts. While the conventional PLL components may take care of a fine tuning, an additional frequency locked loop may take care of a coarse tuning. If the frequency locked loop operates on a coarser level, that is, with a lower resolution, than the conventional PLL, the frequency locked loop is faster than the conventional PLL. While changing the frequency channel, the VCO frequency is thus first quickly coarse tuned to a new value. The coarse tuning may be performed by components, which measure the frequency roughly and introduce an adequate DC shift into the VCO control circuit. As a result, the remaining frequency variations in the divided VCO output signal are so small that the voltage across the integration capacitor of the loop filter remains nearly constant, which implies that the occurring dielectric absorption is negligible.

It is an advantage of the invention that it allows integrating a loop filter despite the strong dielectric absorption occurring in integrated capacitors. The total settling time of the PLL, consisting now of a rough and a fine tuning, is shorter than the settling time of a conventional PLL using an integrated loop filter. The time savings result from the fast and effective coarse tuning. Also the fine tuning is fast, because the frequency step size remaining after the coarse tuning is very small. As the fine tuning of the PLL is performed in a conventional way, there is no disadvantageous effect on the general RF performance of the PLL either.

With an integrated loop filter, significant cost savings in material can be achieved. The production of a PLL may also be rendered easier and quicker, if the very sensitive parts of the PLL are safely inside an IC.

While the above cited U.S. patent application 2004/0100311 A1 proposes a pure feed forward system, which may reach only a poor accuracy, the invention makes use of a feedback system. This means that the frequency can be measured accurately every time the frequency is changed. As the influence of all strongly varying components may be reflected in the detected frequency deviations, the accuracy of the rough tuning can be sufficiently fine for ensuring an operation without any memory effect.

In one embodiment of the invention, the level of the added DC voltage shift depends on an amount of a detected frequency deviation. The accuracy of the DC voltage shift can be selected by choosing the resolution of the detection of the frequency deviation.

In one embodiment of the invention, the frequency deviations are detected on a digital basis, the resulting digital value representing an amount of a respective frequency deviation. The digital value may then be converted into an analog value, forming a basis for generating the DC voltage shift.

The coarse tuning circuit of the proposed PLL may comprise to this end a frequency detector adapted to detect the frequency deviations on a digital basis and to output a digital value representing an amount of a respective frequency deviation. In addition, the coarse tuning circuit may comprise a digital-to-analog (D/A) converter adapted to convert a digital value output by the frequency detector into an analog signal. In addition, the coarse tuning circuit may comprise a DC level shifter adapted to add a DC voltage shift to the control voltage provided by the loop filter, using a level for the DC voltage shift which depends on an analog signal provided by the D/A converter.

The loop filter of the proposed PLL can be realized in various forms. Moreover, it can be active or passive.

In one embodiment of the invention, the loop filter is an active loop filter comprising an operational amplifier. In this case, the coarse tuning circuit may be adapted to add the DC voltage shift to an output voltage of the operational amplifier of the loop filter.

In another embodiment of the invention, the loop filter is a passive loop filter. In this case, the coarse tuning circuit may be adapted to add a DC voltage shift by changing a bias voltage of the loop filter.

The invention can be implemented in any PLL comprising a VCO and a loop filter, and thus as well in any component, device or system comprising such a PLL. It can be used for example, though not exclusively, in fixed or mobile radio communication devices.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 2:
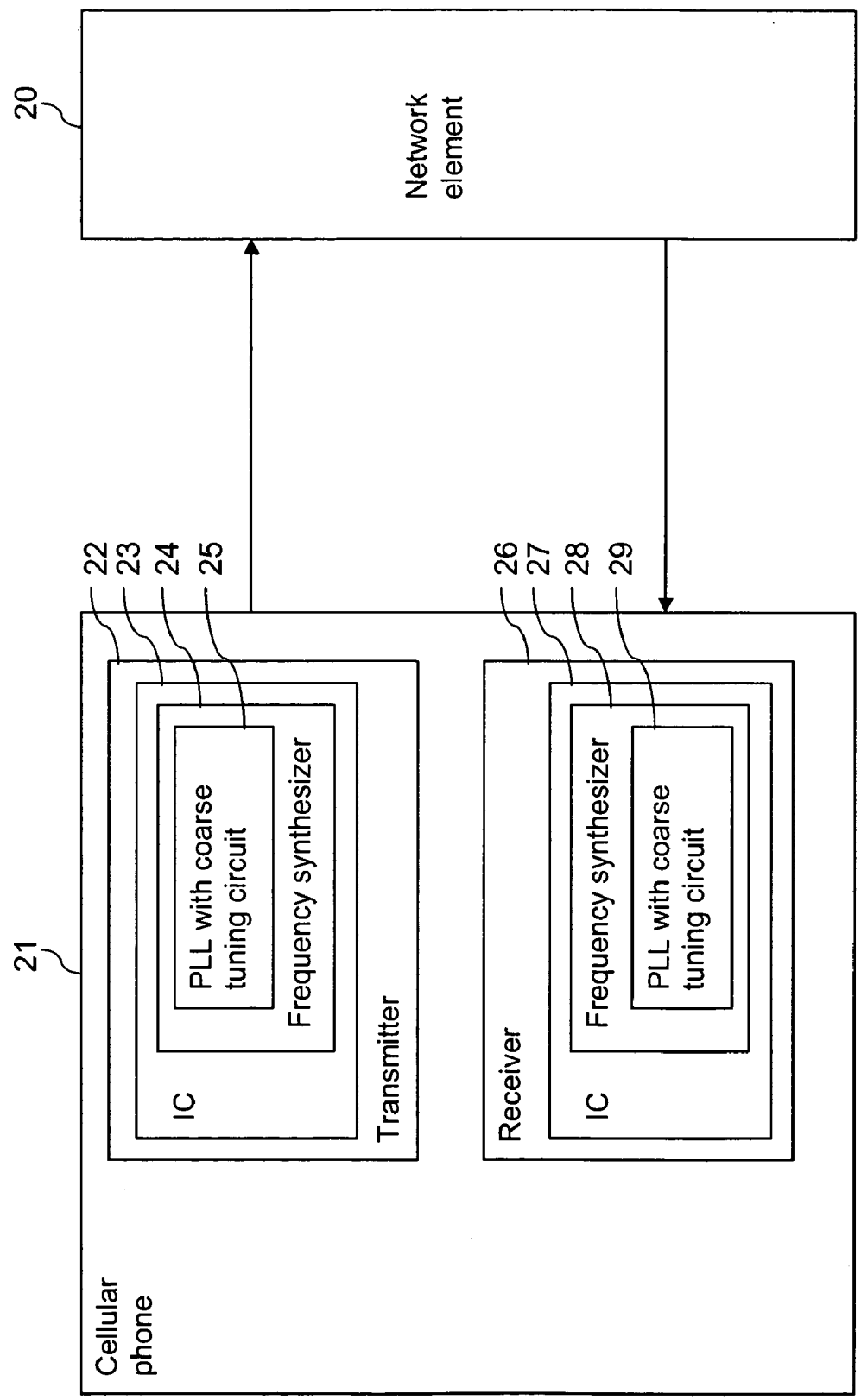
FIG. 2 is a schematic block diagram of an exemplary system in which the invention can be implemented.

FIG. 2 is a schematic block diagram of an exemplary communication system according to the invention, in which a PLL according to an embodiment of the invention is implemented.

The communication system is a cellular communication system comprising a network element 20 of a cellular communication network and a cellular phone 21. The network element can be, for instance, a base station.

The cellular phone 21 is an exemplary electronic device according to the invention. It comprises a transmitter 22 and a receiver 26. It is to be understood that the functions of the transmitter 22 and the functions of the receiver 26 could also be combined in a transceiver.

The transmitter 22 includes an IC 23 with a frequency synthesizer 24. The frequency synthesizer 24 comprises a PLL 25.

The receiver 26 includes an IC 27 with a frequency synthesizer 28. The frequency synthesizer 28 comprises a PLL 29.

The cellular phone 21 can be designed in a conventional manner, except that the PLL 25 of the transmitter 22 and the PLL 29 of the receiver 26 comprise a coarse tuning circuit.

When data is to be transmitted by the cellular phone 21 to the network element 20, the data has to be modulated in some way onto RF carrier signals. The frequency synthesizer 24 of the transmitter 22 is responsible for generating the required RF signals. The PLL 25 of the frequency synthesizer 24 multiplies to this end a reference frequency provided by a reference clock of the frequency synthesizer 24 (not shown) with an appropriate factor for obtaining an RF signal having a selected frequency.

When modulated RF signals transmitted by the network element 20 are received at the cellular phone 21, the receiver 26 downconverts the received RF signals by mixing them with a locally generated RF signal having a suitable frequency. Suitable RF signals are generated locally by the frequency synthesizer 28. The PLL 29 of the frequency synthesizer 28 multiplies to this end the frequency of a reference signal provided by a reference clock of the frequency synthesizer 28 (not shown) with an appropriate factor.

Figure 1:
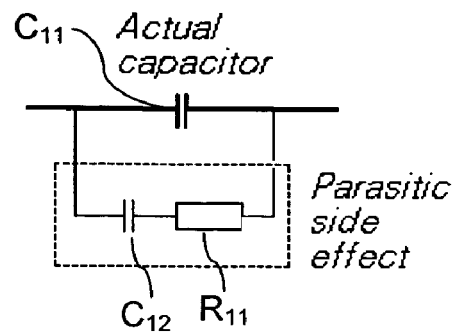
FIG. 1 is a simple model of a dielectric absorption in a capacitor.
Figure 3:
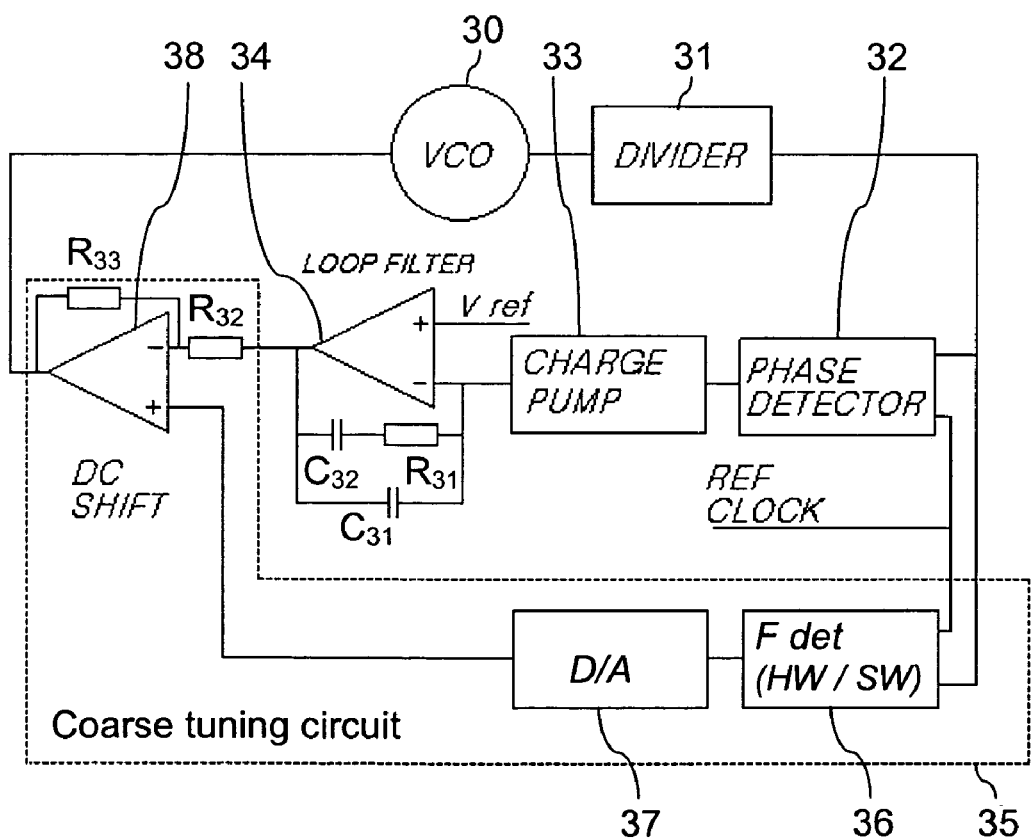
FIG. 3 is a schematic circuit diagram of a PLL according to a first embodiment of the invention for use in the system of FIG. 2.

FIG. 3 presents a first embodiment of a PLL 25, 29 that may be implemented in the frequency synthesizers 24, 28 of the cellular phone 21 of FIG. 2.

The PLL 25, 29 comprises a VCO 30. The output of the VCO 30 is connected via a programmable frequency divider 31 on the one hand to a first input of a phase detector 32 and on the other hand to a first input of a digital frequency detector 36. It has to be noted that the frequency detector 36 can be realized in hardware and/or in software that is executed by a processing component of the IC 23, 27 (not shown).

Moreover, a reference clock signal REF CLOCK is applied on the one hand to a second input of the phase detector 32 and one the other hand to a second input of the frequency detector 36. The reference clock signal is generated by the reference clock of the respective frequency synthesizer 24, 28 comprising the PLL 25, 29.

The output of the phase detector 32 is connected via a charge pump 33 to a first input of a loop filter, more specifically to the inverting input of a first operational amplifier 34 of the loop filter. In addition, a reference voltage $V_{ref}$ is applied to the non-inverting input of the first operational amplifier 34. The loop filter comprises in addition integrating capacitors. That is, a first capacitor $C_{31}$ is arranged between the inverting input of the first operational amplifier 34 and the output of the first operational amplifier 34. Further, a series connection of a resistor $R_{31}$ and a second capacitor $C_{32}$ is arranged in parallel to the first capacitor $C_{31}$ between the inverting input of the first operational amplifier 34 and the output of the first operational amplifier 34.

The output of the first operational amplifier 34 is connected via further resistor $R_{32}$ to the inverting input of a second operational amplifier 38. Moreover, the output of the frequency detector 36 is connected via a D/A converter unit 37 to the non-inverting input of the second operational amplifier 38.

A resistor $R_{33}$ is arranged between the inverting input of the second operational amplifier 38 and the output of the second operational amplifier 38. The operational amplifier 38 and the resistors $R_{32}$ and $R_{33}$ form a DC shifter.

The output of the second operational amplifier 38, finally, is connected to a control input of the VCO 30.

The arrangement of VCO 30, frequency divider 31, phase detector 32, charge pump 33 and loop filter 34, $C_{31}$, $C_{32}$, $R_{31}$ corresponds to the arrangement in an exemplary conventional PLL using an active loop filter. In such a conventional PLL, the output of the loop filter is connected directly to an input of the VCO, though. The frequency detector 36, the D/A converter unit 37 and the DC shifter 38, $R_{32}$, $R_{33}$ form an exemplary, digitally controlled coarse tuning circuit 35, which is added according to the invention to a conventional PLL.

The operation of the PLL 25, 29 depicted in FIG. 3 will now be described in more detail with reference to the flow chart of FIG. 4.

Figure 4:
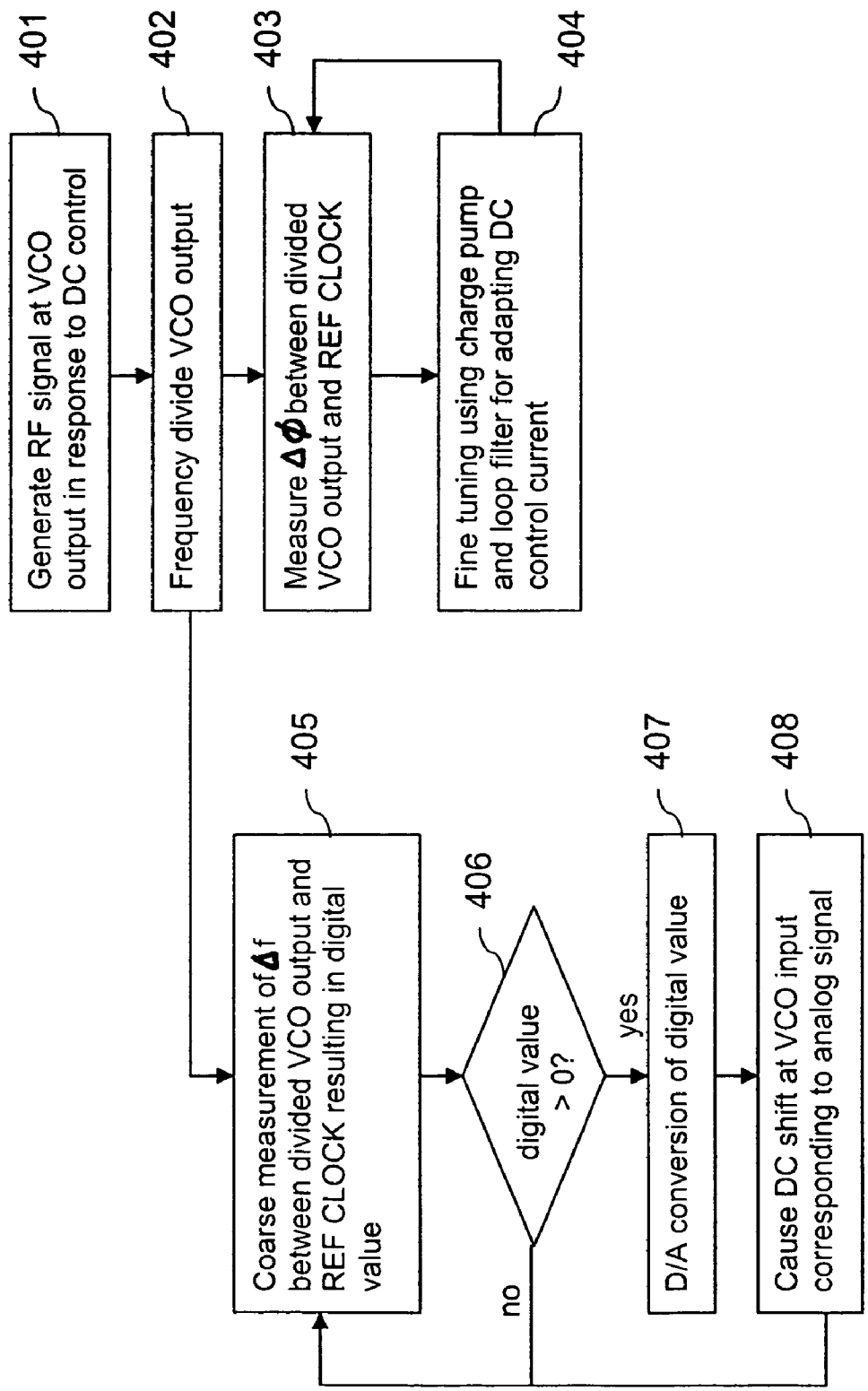
FIG. 4 is a flow chart illustrating an operation in the PLL of FIG. 3.

Apart from the influence by the coarse tuning circuit 35, the PLL 25, 29 operates in a well known manner, as illustrated on the right hand side of FIG. 4.

The VCO 30 thus generates and outputs an RF signal having a frequency, which is determined by a DC control voltage applied to the control input of the VCO 30 (step 401). The output signal of the VCO 30 is used as the output signal of the frequency synthesizer 24, 28. In addition, the VCO output signal is frequency divided by the frequency divider 31 with a programmed factor (step 402). The resulting frequency divided VCO output signal is forwarded to the phase detector 32. The phase detector 32 detects the phase difference Δϕ between the frequency divided VCO output signal and the reference signal REF CLOCK, and outputs a corresponding error signal (step 403).

The PLL 25, 29 is locked when the phase difference Δϕ between the frequency divided VCO output signal and the reference signal REF CLOCK is equal to zero, which implies that also the frequencies of the compared signals are equal. For achieving or maintaining a locked state, the charge pump 33 generates current impulses, the lengths of which are controlled by the error signal provided by the phase detector 32. As indicated by its name, the charge pump 33 thus pumps charges i.e. a supplied current. The current impulses of the charge pump 33 are fed into the loop-filter. By means of its capacitors $C_{31}$, $C_{32}$, the loop-filter is able to provide a stable DC control voltage to the control input of the VCO 30, which is adjusted continuously in accordance with the current impulses provided by the charge pump 33 and thus in accordance with the error signal provided by the phase detector 32 (step 404).

This conventional operation is appropriate as long as the division ratio applied by the frequency divider 31 is kept constant. In this case, only a fine tuning is required once a locked state has been achieved.

The division ratio applied by the frequency divider 31 is set to a new value, however, whenever the frequency synthesizer 24, 28 is required to provide an RF signal having a different frequency than before. In these cases, the conventional tuning would take a rather long time due to the dielectric absorption in the dielectric insulator layers of the capacitors $C_{31}$, $C_{32}$ of the loop filter.

In order to accelerate the tuning of the PLL 25, 29 to a new frequency, an additional coarse tuning is carried out by the coarse tuning circuit 35, as illustrated on the left and side of FIG. 4.

For the coarse tuning, the frequency detector 36 determines roughly the difference in frequency Δf between the divided VCO output signal and the reference signal REF CLOCK on a digital basis (step 405).

The further steps 407 and 408 have only an impact, in case the frequency difference Δf is detectable with the selected resolution of the digital detection (step 406). Thus, in case the frequency deviation is small, the actual control of the PLL is left entirely to the conventional components.

The digital value output by the frequency detector 36 is fed to the D/A converter unit 37. The D/A converter unit 37 includes a D/A converter portion, which converts the digital value representing the current frequency deviation into an analog voltage, and a sequential logic portion, which drives the D/A converter portion (step 407).

The output voltage of the D/A converter unit 37 is then used as a reference for the DC level shifter. The DC level shifter changes the DC level of the DC control voltage provided by the loop filter in accordance with the roughly determined frequency difference Δf (step 408).

Thus, when changing the channel by reprogramming the frequency divider 31, the frequency of a provided RF signal is first quickly coarse-tuned to a new value. The fine tuning components then only have to take care of small phase differences such that the voltage over the integration capacitors $C_{31}$, $C_{32}$ is nearly constant. The total loop gain stays stable and immune to the coarse tuning.

The presented PLL 25, 29 can be designed for instance for an accuracy of 1 MHz. With the proposed coarse tuning, the fine tuning has to adjust the voltage in the loop filter only by about 20 mV to reach the precise frequency. Since the rough tuning by the coarse tuning circuit 35 can be realized to operate very fast and since the fine tuning circuit has to take care only of small adjustments, the PLL 25, 29 can be adjusted quickly to any new channel.

The speed and the accuracy achieved with the coarse tuning circuit 35 depend contrariwise on the amount of bits, which are used by the frequency detector 36 for representing a detected frequency difference Δf. If the bit count is four, for example, four measurement cycles are needed by the frequency detector 36 for determining the frequency deviation, and $2^4=16$ possible DC shifting levels are available.

Figure 5:
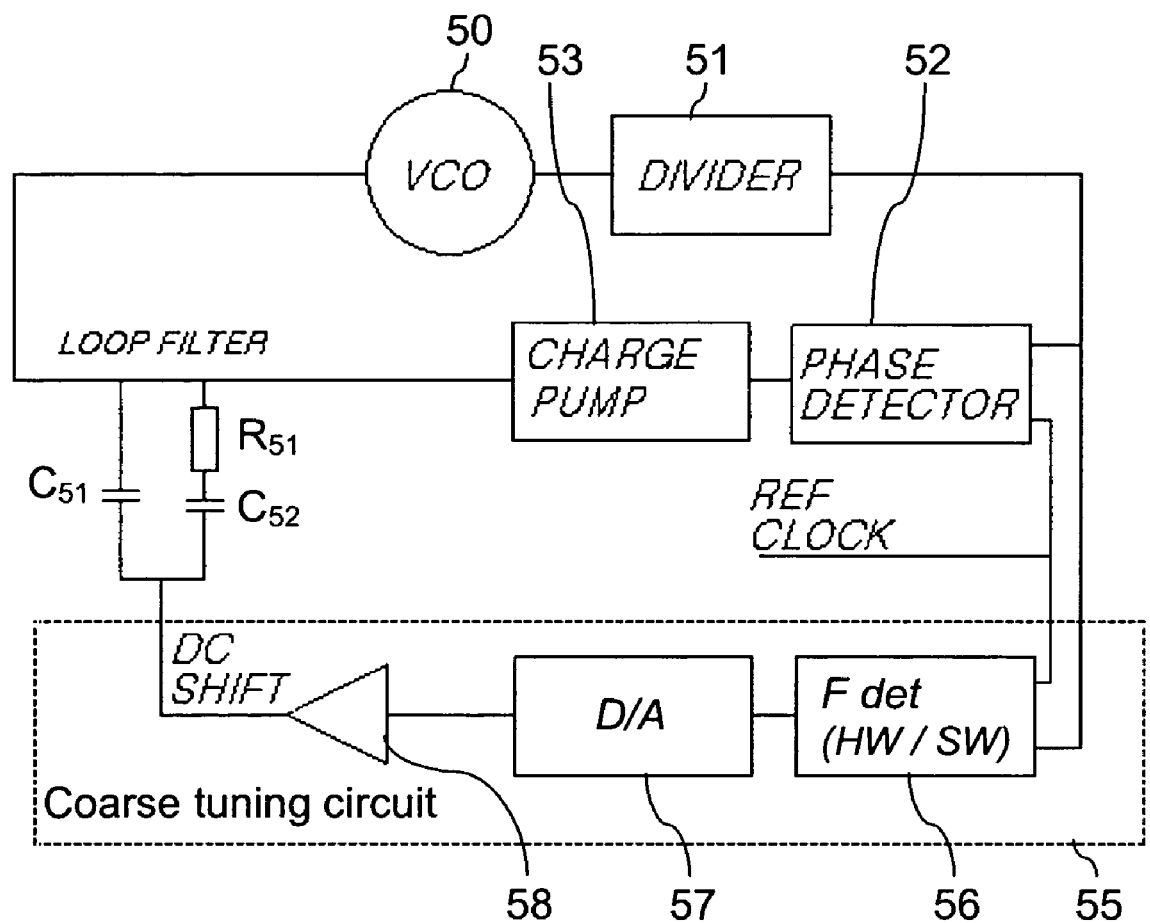
FIG. 5 is a schematic circuit diagram of a PLL according to a second embodiment of the invention for use in the system of FIG. 2.

FIG. 5 presents a second embodiment of a PLL 25, 29 that may be implemented in the frequency synthesizers 24, 28 of the cellular phone 21 of FIG. 2.

The PLL 25, 29 comprises a VCO 50. The output of the VCO 50 is connected via a programmable frequency divider 51 on the one hand to a first input of a phase detector 52 and on the other hand to a first input of a digital frequency detector 56. Also the frequency detector 56 can be realized in hardware and/or in software.

Moreover, a reference clock signal REF CLOCK is applied on the one hand to a second input of the phase detector 52 and one the other hand to a second input of the frequency detector 56.

The output of the phase detector 52 is connected via a charge pump 53 and a loop filter to a control input of the VCO 50.

The output of the frequency detector 56 is connected via a D/A converter unit 57 to an amplifier 58.

In this embodiment, the loop filter is a passive loop filter. It comprises a first capacitor $C_{51}$ and a series connection of a resistor $R_{51}$ and a second capacitor $C_{52}$, which are arranged in parallel between the output of the charge pump 53 and the output of the amplifier 58. The amplifier 58 functions as a DC shifter.

The arrangement of VCO 50, frequency divider 51, phase detector 52, charge pump 53 and loop filter $C_{51}$, $C_{52}$, $R_{51}$ correspond to the arrangement of an exemplary conventional PLL using a passive loop filter. In a conventional PLL, the loop filter would be connected between the output of the charge pump 53 and ground, though. The frequency detector 56, the D/A converter unit 57 and the DC shifter 58 form an exemplary, digitally controlled coarse tuning circuit 55, which is added according to the invention to a conventional PLL.

The components corresponding to a conventional PLL operate in a conventional manner for achieving a fine tuning. The coarse tuning circuit 55 operates basically in the same manner as the coarse tuning circuit 35 described with reference to FIGS. 3 and 4. Only in this case, the output of the DC shifter 58 is used for changing a bias voltage of the loop filter.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for operating a phase locked loop, which phase locked loop comprises a voltage controlled oscillator and an active loop filter, wherein said voltage controlled oscillator generates an alternating-current output signal having a frequency which depends on an applied control voltage, and wherein said active loop filter provides a control voltage to said voltage controlled oscillator, said control voltage reflecting determined phase differences between a potentially frequency divided output signal of said voltage controlled oscillator and a reference signal, said method comprising:

detecting frequency deviations between said potentially frequency divided output signal of said voltage controlled oscillator and said reference signal, wherein a resolution employed for detecting said frequency deviations is lower than a resolution employed for determining said phase differences; and adding a direct-current voltage shift at an output of said active loop filter to said control voltage provided by said active loop filter, in case a frequency deviation is detected for reducing dielectric absorption of at least one capacitor of said active loop filter, said phase locked loop, including said at least one capacitor, being integrated in an integrated circuit.

2. The method according to claim 1, wherein a level of said added direct-current voltage shift depends on an amount of a detected frequency deviation.

3. The method according to claim 1, wherein said frequency deviations are detected on a digital basis, and wherein a resulting digital value, representing an amount of a respective frequency deviation, is converted into an analog value, said analog value forming a basis for generating said direct-current voltage shift.

4. Apparatus comprising:

means for generating an alternating-current output signal having a frequency which depends on an applied control voltage;

active means for providing a control voltage to said means for generating an alternating-current output signal, said control voltage reflecting determined phase differences between a potentially frequency divided output signal of said means for generating an alternating-current output signal and a reference signal wherein said active means comprise at least one capacitor;

means for detecting frequency deviations between said potentially frequency divided output signal of said means for generating an alternating-current output signal and a reference signal, wherein a resolution employed for detecting said frequency deviations is lower than a resolution employed for determining said phase differences; and means for adding a direct-current voltage shift at an output of said active means for providing a control voltage to said control voltage provided by said active means for providing a control voltage, in case a frequency deviation is detected by said means for detecting frequency deviations, for reducing dielectric absorption of said at least one capacitor;

wherein said means for generating an alternating-current output signal, said active means for providing a control voltage, including said at least one capacitor, said means for detecting frequency deviations and said means for adding a direct-current voltage shift are integrated in an integrated circuit.

5. A phase locked loop comprising:

a voltage controlled oscillator adapted to generate an alternating-current output signal having a frequency which depends on an applied control voltage;

an active loop filter adapted to provide said control voltage to said voltage controlled oscillator, said control voltage reflecting determined phase differences between a potentially frequency divided output signal of said voltage controlled oscillator and a reference signal wherein said active loop filter comprises at least one capacitor; and a coarse tuning circuit adapted to detect frequency deviations between said potentially frequency divided output signal of said voltage controlled oscillator and said reference signal, wherein a resolution employed for detecting said frequency deviations is lower than a resolution employed for determining said phase differences, and adapted to add a direct-current voltage shift at an output of said active loop filter to said control voltage provided by said active loop filter, in case a frequency deviation is detected, for reducing dielectric absorption of said at least one capacitor of said active loop filter;

wherein said phase locked loop, including said at least one capacitor, is integrated in an integrated circuit.

6. The phase locked loop according to claim 5, wherein said coarse tuning circuit comprises:

a frequency detector adapted to detect said frequency deviations on a digital basis and to output a digital value representing an amount of a respective frequency deviation;

a digital-to-analog converter adapted to convert a digital value output by said frequency detector into an analog signal; and a direct-current level shifter adapted to add said direct-current voltage shift to said control voltage provided by said active loop filter, using a level for said direct-current voltage shift which depends on said analog signal provided by said digital-to-analog converter.

7. The phase locked loop according to claim 5, wherein said active loop filter comprises an operational amplifier, and wherein said coarse tuning circuit is adapted to add said direct current voltage shift to said control voltage provided by said active loop filter by adding said direct-current voltage shift to an output voltage of said operational amplifier.

8. The phase locked loop according to claim 5, wherein said loop filter is a passive loop filter, and wherein said coarse tuning circuit is adapted to add a direct-current voltage shift to said control voltage provided by said loop filter by changing a bias voltage of said loop filter.

9. A frequency synthesizer comprising a phase locked loop according to claim 5.

10. An integrated circuit comprising a phase locked loop according to claim 5.

11. A radio receiver comprising a phase locked loop according to claim 5.

12. A radio transmitter comprising a phase locked loop according to claim 5.

13. An electronic device comprising a phase locked loop according to claim 5.

14. A mobile electronic device comprising a phase locked loop with:

a voltage controlled oscillator adapted to generate an alternating-current output signal having a frequency which depends on an applied control voltage;

an active loop filter adapted to provide said control voltage to said voltage controlled oscillator, said control voltage reflecting determined phase differences between a potentially frequency divided output signal of said voltage controlled oscillator and a reference signal wherein said active loop filter comprises at least one capacitor; and a coarse tuning circuit adapted to detect frequency deviations between said potentially frequency divided output signal of said voltage controlled oscillator and said reference signal, wherein a resolution employed for detecting said frequency deviations is lower than a resolution employed for determining said phase differences, and adapted to add a direct-current voltage shift at an output of said active loop filter to said control voltage provided by said active loop filter, in case a frequency deviation is detected, for reducing dielectric absorption of said at least one capacitor of said active loop filter;

wherein said phase locked loop, including said at least one capacitor, is integrated in an integrated circuit.

15. A communication system comprising an electronic device, which electronic device includes a phase locked loop with:

a voltage controlled oscillator adapted to generate an alternating-current output signal having a frequency which depends on an applied control voltage;

an active loop filter adapted to provide said control voltage to said voltage controlled oscillator, said control voltage reflecting determined phase differences between a potentially frequency divided output signal of said voltage controlled oscillator and a reference signal wherein said active loop filter comprises at least one capacitor; and a coarse tuning circuit adapted to detect frequency deviations between said, potentially frequency divided output signal of said voltage controlled oscillator and said reference signal, wherein a resolution employed for detecting said frequency deviations is lower than a resolution employed for determining said phase differences, and adapted to add a direct-current voltage shift at an output of said active loop filter to said control voltage provided by said active loop filter, in case a frequency deviation is detected for preventing dielectric absorption of said at least one capacitor of said active loop filter;

wherein said phase locked loop, including said at least one capacitor, is integrated in an integrated circuit.

16. A software program product in which a software code for operating a phase locked loop is stored, which phase locked loop comprises a voltage controlled oscillator and an active loop filter, wherein said voltage controlled oscillator generates an alternating-current output signal having a frequency which depends on an applied control voltage, and wherein said active loop filter provides said control voltage to said voltage controlled oscillator, said control voltage reflecting determined phase differences between a potentially frequency divided output signal of said voltage controlled oscillator and a reference signal, said software code realizing the following steps when being executed:

detecting frequency deviations between said potentially frequency divided output signal of said voltage controlled oscillator and said reference signal, wherein a resolution employed for detecting said frequency deviations is lower than a resolution employed for determining said phase differences; and causing an adding of a direct-current voltage shift at an output of said active loop filter to said control voltage provided by said active loop filter, in case a frequency deviation is detected for preventing dielectric absorption of at least one capacitor of said active loop filter, said phase locked loop, including said at least one capacitor, being integrated on an integrated circuit.

17. The method according to claim 1, wherein said active loop filter comprises an operational amplifier, and wherein adding said direct current voltage shift to said control voltage provided by said active loop filter comprises adding said direct-current voltage shift to an output voltage of said operational amplifier.

18. The method according to claim 1, wherein said loop filter is a passive loop filter, and wherein adding said direct-current voltage shift to said control voltage provided by said loop filter comprises changing a bias voltage of said loop filter.

19. The phase locked loop according to claim 5, wherein said coarse tuning circuit is adapted to add a direct-current voltage shift having a level which depends on an amount of a detected frequency deviation.

* * * * *